US006576397B2

(12) United States Patent
Kita et al.

(10) Patent No.: US 6,576,397 B2
(45) Date of Patent: Jun. 10, 2003

(54) HEAT-SENSITIVE LITHOGRAPHIC PRINTING PLATE PRECURSOR

(75) Inventors: Nobuyuki Kita, Shizuoka (JP); Kazuo Maemoto, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 106 days.

(21) Appl. No.: 09/729,350

(22) Filed: Dec. 5, 2000

(65) Prior Publication Data

US 2001/0003643 A1 Jun. 14, 2001

(30) Foreign Application Priority Data

Dec. 6, 1999 (JP) .......................................... 11-346317

(51) Int. Cl.$^{7}$ ................................................ G03F 7/038

(52) U.S. Cl. ............................... 430/270.1; 430/271.1; 430/281.1; 430/286.1; 430/287.1; 430/302; 101/453; 101/463.1

(58) Field of Search .......................... 430/270.1, 271.1, 430/281.1, 286.1, 287.1, 302, 348, 944, 945, 964; 101/453, 463.1

(56) References Cited

U.S. PATENT DOCUMENTS

| | | | | | |
|---|---|---|---|---|---|
| 5,246,815 | A | * | 9/1993 | Ichimura et al. | 430/270 |
| 5,609,993 | A | * | 3/1997 | Hase et al. | 430/302 |
| 5,840,463 | A | * | 11/1998 | Blanchet-Fincher | 430/201 |
| 5,998,095 | A | * | 12/1999 | Nagase | 430/273.1 |
| 6,159,657 | A | * | 12/2000 | Fleming et al. | 430/270.1 |
| 6,171,748 | B1 | * | 1/2001 | Tanaka et al. | 430/138 |
| 6,218,073 | B1 | * | 4/2001 | Shimizu et al. | 430/273.1 |
| 6,242,156 | B1 | * | 6/2001 | Teng | 430/270.1 |
| 6,300,032 | B1 | * | 10/2001 | Van Damme et al. | 430/188 |
| 6,312,866 | B1 | * | 11/2001 | Obuchowicz et al. | 430/270.1 |
| 6,358,668 | B1 | * | 3/2002 | Leenders et al. | 430/271.1 |
| 2001/0036592 | A1 | * | 11/2001 | Hoshi et al. | 430/270.1 |
| 2002/0136987 | A1 | * | 9/2002 | Oshima | 430/281.1 |

FOREIGN PATENT DOCUMENTS

| | | |
|---|---|---|
| EP | 0816070 | 1/1998 |
| EP | 0832739 | 4/1998 |
| EP | 0931647 | 7/1999 |
| EP | 1025990 | 8/2000 |
| WO | WO98/51496 | 11/1998 |

* cited by examiner

*Primary Examiner*—Hoa Van Le
*Assistant Examiner*—Barbara Gilliam
(74) *Attorney, Agent, or Firm*—Burns, Doane, Swecker & Mathis, LLP

(57) ABSTRACT

A heat-sensitive lithographic printing plate precursor, comprising a support having a hydrophilic surface on which (1) a thermal polymerization layer comprising an aqueous alkali-soluble polymer having addition polymerizable unsaturated bonds at its side chains and a thermal polymerization initiator and (2) a water-soluble overcoat layer comprising a water-soluble polymer and a compound capable of converting light into heat are provided in this order.

3 Claims, No Drawings

HEAT-SENSITIVE LITHOGRAPHIC PRINTING PLATE PRECURSOR

FIELD OF THE INVENTION

The present invention relates to a heat-sensitive lithographic printing plate precursor having suitability for computer-to-plate system. More specifically, the present invention relates to a heat-sensitive lithographic printing plate precursor for making a lithographic printing plate, wherein images are recorded by infrared laser scanning exposure based on digital signals and then subjected to development-processing.

BACKGROUND OF THE INVENTION

A large number of studies have been made on lithographic plates for computer-to-plate (CTP) system that has achieved brilliant progress in recent years, and various methods applicable to such lithographic printing plates have been proposed. As one of the methods already in the actual use, there is a method of making a printing plate for CTP system due to utilization of photo-polymerization. More specifically, the printing plate making therein comprises performing laser energy irradiation to cause polymerization in the irradiated areas and render the areas insoluble, thereby forming image areas, and dissolving and removing the unirradiated areas by development.

In JP-A-4-221958, JP-A-5-281728, JP-A-8-146605 and JP-A-8-220758 (the term "JP-A" as used herein means an "unexamined published Japanese patent application) are disclosed the photo-polymerization-utilized lithographic printing plate precursors for CTP system which each comprise (1) a support having a hydrophilic surface, (2) a photo-polymerizable composition layer containing a sensitizing dye, a photo-polymerization initiator, a polymerizable unsaturated monomer and a binder polymer, and (3) an oxygen-blocking overcoat layer which is impervious to oxygen.

Because of utilization of photo-polymerization, those lithographic printing plate precursors for CTP system have a sensitive property in a visible region corresponding to visible laser beams used as a light source, e.g., argon ion laser and FD-YAG laser. As a result, the printing plate precursors cause the inconvenience of having to be handled in a darkroom.

SUMMARY OF THE INVENTION

An object of the present invention is therefore to provide a lithographic printing plate precursor for computer-to-plate (CTP) system, which can eliminate the inconvenience of being used in a darkroom and enables handling in a bright room.

The present inventors have found that the aforementioned object can be attained with a lithographic printing plate precursor in which the thermal polymerization caused by infrared laser irradiation is utilized for image formation, thereby achieving the present invention.

The Embodiments and preferred embodiments of the present invention are shown below:

(1) A heat-sensitive lithographic printing plate precursor, comprising a support having a hydrophilic surface on which (1) a thermal polymerization layer comprising an aqueous alkali-soluble polymer having addition polymerizable unsaturated bonds at its side chains and a thermal polymerization initiator and (2) a water-soluble overcoat layer comprising a water-soluble polymer and a compound capable of converting light into heat are provided in this order.

(2) The heat-sensitive lithographic printing plate precursor as described in Embodiment (1), wherein the addition polymerizable unsaturated bonds are constituted by functional groups in at least one group selected from the group consisting of allyl, acryl and methacryl groups.

(3) The heat-sensitive lithographic printing plate precursor as described in Embodiment (1) or (2), wherein the thermal polymerization initiator is a peroxide or a hexaarylbiimidazole compound.

(4) The heat-sensitive lithographic printing plate precursor as described in any of Embodiments (1) to (3), wherein the water-soluble polymer is a polymer containing vinyl alcohol units in a proportion of at least 65 mole %.

Making additional remark, European Patent 889,363 discloses a near infrared-sensitive composition comprising a near infrared absorbing dye, hexaarylbiimidazole compound (HABI), a photo-polymerization substance and a chain transfer agent. Although this publication has a description such that the exposure is performed via a film having negative or positive images, the present inventor have found that the printing plate made from the light-sensitive composition disclosed therein cannot form images by the laser scanning exposure based on a film-free CTP system. In other words, the publication described above neither discloses nor suggests on a printing plate for CTP system as aimed at by the present invention.

DETAILED DESCRIPTION OF THE INVENTION

As an example of the support having a hydrophilic surface which can be suitably used in the present invention, an aluminum plate is exemplified. Such an aluminum plate (or sheet) includes a pure aluminum plate and alloy plates containing aluminum as a main component and very small amounts of foreign elements. Further, plastic-laminated pure aluminum and aluminum alloy plates may be included therein.

Examples of foreign elements contained in the aluminum alloys include silicon, iron, manganese, copper, magnesium, chromium, zinc, bismuth, nickel, and titanium. The proportion of foreign elements in the alloys is 10% by weight or less. However, the aluminum plate applied to the present invention can be selected properly from aluminum plates made of hitherto well-known conventional materials.

The suitable thickness of such a substrate as described is from about 0.05 mm to about 0.6 mm, preferably from 0.1 mm to 0.4 mm, particularly preferably from 0.15 mm to 0.3 mm.

Prior to using an aluminum plate, it is desirable that surface treatment, such as graining or anodic oxidation treatment, be given to the aluminum plate. This surface treatment can easily secure for the aluminum plate both hydrophilic property and adhesive property to a thermal polymerization layer to be provided thereon.

The graining treatment of an aluminum plate can be effected using various methods, e.g., a method of mechanically graining the surface, a method of electrochemically graining the surface by electrochemical dissolution and a method of chemically graining the surface to cause selective dissolution of the surface. As the mechanical graining method can be used a well known method, e.g., a ball abrasion method, a brush abrasion method, a blast abrasion method and a buff abrasion method. As the chemical graining method, the method as disclosed in JP-A-54-31187 is suitable, wherein the aluminum plate is immersed in a saturated water solution of aluminum salt of mineral acid. As the electrochemical graining method, the method of graining in an electrolytic solution containing an acid, such as hydrochloric acid or nitric acid, by applying thereto alternating or direct current can be exemplified. In addition, an electrolytic graining method using a mixed acid, as described in JP-A-54-63902 may be adopted.

In the above graining method, it is desirable to carry out the graining treatment so that the aluminum plate surface has a center line average surface roughness (Ra) of 0.3 to 1.0 $\mu$m.

The thus grained aluminum plate is subjected to etching treatment with an alkali, such as an aqueous solution of potassium hydroxide or sodium hydroxide, and then is subjected to neutralization treatment, and further anodic oxidation treatment for enhancing abrasion resistance, if desired.

Examples of the electrolytes usable for anodic oxidation of aluminum plates include various electrolytes capable of forming porous oxide film (i.e., oxidation film). In general, sulfuric acid, hydrochloric acid, oxalic acid, chromic acid or a mixture of two or more thereof is employed as such an electrolyte. The electrolyte concentration is properly determined depending on the kind of the electrolyte used.

The treatment conditions for anodic oxidation vary according to the electrolyte used, so they cannot be generalized. However, it is practically favorable to choose the electrolyte concentration from the range of 1 to 80% by weight, the solution temperature from the range of 5 to 70° C., the current density from the range of 5 to 60 amperes/$dm^2$, the voltage from the range of 1 to 100 V and the electrolysis time from the range of 10 seconds to 5 minutes.

The suitable coverage of the oxide film thus formed is from 1.0 to 5.0 $g/m^2$, particularly preferably from 1.5 to 4.0 $g/m^2$.

As the substrate having a hydrophilic surface of the present invention, the substrate having an oxide film formed by the foregoing surface treatment may be used as it is. For the purpose of further increasing the hydrophilic property and the adhesiveness to a thermal polymerization layer, however, it is also favorable that the substrate having an oxide film undergoes immersion treatment in an aqueous solution of alkali silicate, such as sodium silicate or undercoating treatment with an aqueous solution of polyvinyl phosphonic acid, polyacrylic acid or a homo- or copolymer having sulfonic acid groups in its side chains.

In addition, as the substrate having a hydrophilic surface of the present invention, the supports disclosed in JP-A-7-159983 and JP-A-8-320551 can be suitably used, which each have the surface to which functional groups capable of causing addition reaction in the presence of radicals are bound by covalent bonds.

As examples of the aqueous alkali-soluble polymer of the present invention having addition polymerizable unsaturated bonds in its side chains, the copolymers disclosed in JP-A-59-53836 which are prepared from allyl(meth)acrylate, (meth)acrylic acid and, if needed, other addition polymerizable vinyl monomers, the polymers disclosed in JP-A-59-71048 which are prepared by esterifying polymers containing carboxylic acid groups or carboxylic acid anhydride groups in their side chains or as their end groups with ethylenically unsaturated compounds having alcoholic hydroxyl groups, and the copolymers disclosed in JP-A-10-260536 which are prepared by modifying copolymers prepared from (meth)acrylate, (meth)acrylic acid and, if needed, other addition polymerizable vinyl monomers with glycidyl (meth)acrylate are exemplified. Of these polymers, the copolymers prepared from allyl(meth)acrylate, (meth) acrylic acid and, if needed, other addition polymerizable vinyl monomers are preferred.

The aqueous alkali-soluble polymer of the present invention having addition polymerizable unsaturated bonds in its side chains is contained in a proportion of 30 to 98 weight %, preferably 60 to 95 weight %, based on the total solid components in the thermal polymerization layer. When the proportion is below that range, satisfactory images cannot be formed.

Examples of a thermal polymerization initiator usable in the present invention include azo compounds such as azobisisobutyronitrile, azobiscyclohexanecarbonitrile and 1-phenylazoisobutyronitrile, azide compounds such as benzenesulfonic acid azide and p-toluenesulfonic acid azide, the peroxides disclosed in JP-A-2-244050 and the hexaarylbiimidazole compounds (HABI) disclosed in JP-A-48-38403. Of these thermal polymerization initiators, the peroxides and HABI are preferred in particular.

Examples of the peroxides include, e.g., methyl ethyl ketone peroxide, cyclohexanone peroxide, 3,3,5-trimethylcyclohexanone peroxide, methylcyclohexanone peroxide, acetylacetone peroxide, 1,1-bis(t-butylperoxy)-3,3,5-trimethylcyclohexane, 1,1-bis(t-butylperoxy) cyclohexane, 2,2-bis(t-butylperoxy)butane, t-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-t-butyl peroxide, t-butylcumyl peroxide, dicumyl peroxide, bis(t-butylperoxyisopropyl)benzene, 2,5-dimethyl-2,5-di(t-butylperoxy)hexane, 2,5-dimethyl-2,5-di(t-butylperoxy) hexyne-3, acetyl peroxide, isobutyryl peroxide, octanoyl peroxide, decanoyl peroxide, lauroyl peroxide, 3,5,5-trimethylhexanoyl peroxide, peroxysuccinic acid, benzoyl peroxide, 2,4-dichlorobenzoyl peroxide, m-toluoyl peroxide, diisopropylperoxydicarbonate, di-2-ethylhexylperoxydicarbonate, di-2-ethoxyethylperoxydicarbonate, dimethoxyisopropylperoxycarbonate, di(3-methyl-3-methoxybutyl)peroxydicarbonate, t-butylperoxyacetate, t-butylperoxypivalate, t-butylperoxyneodecanoate, t-butylperoxyoctanoate, t-butylperoxy-3,5,5-trimethylhexanoate, t-butylperoxylaurate, t-butylperoxybenzoate, bis(t-butylperoxy)isophthalate, 2,5-dimethyl-2,5-bis(benzoylperoxy)hexane, t-butylperoxymaleic acid, t-butylperoxyisopropylcarbonate, 3,3',4,4'-tetrakis(t-butylperoxycarbonyl)benzophenone, 3,3',4,4'-tetrakis(t-amylperoxycarbonyl)benzophenone, 3,3',4,4'-tetrakis(t-hexylperoxycarbonyl)benzophenone, 3,3',4,4'-tetrakis(t-octylperoxycarbonyl)benzophenone, 3,3',4,4'-tetrakis(cumylperoxycarbonyl)benzophenone, 3,3',4,4'-tetrakis(p-isopropylcumylperoxycarbonyl)benzophenone, carbonyldi(t-butylperoxydihydrodiphthalate) and carbonyldi(t-hexylperoxydihydrodiphthalate).

Of these peroxides, peroxyesters such as 3,3',4,4'-tetrakis (t-butylperoxycarbonyl)benzophenone (BTTB), 3,3',4,4'-tetrakis(t-amylperoxycarbonyl)benzophenone, 3,3',4,4'-tetrakis(t-hexylperoxycarbonyl)benzophenone, 3,3',4,4'-tetrakis(t-octylperoxycarbonyl)benzophenone, 3,3',4,4'-tetrakis(cumylperoxycarbonyl)benzophenone, 3,3',4,4'-tetrakis(p-isopropylcumylperoxycarbonyl)benzophenone and bis(t-butylperoxy)isophthalate are preferred.

Examples of HABI used in the present invention include 2-(o-chlorophenyl)-4,5-diphenylimidazolyl dimer (o-C1-HABI), 2-o-chlorophenyl)-4,5-bis (m-methoxyphenyl) imidazolyl dimer, 2-(o-methoxyphenyl)-4,5-diphenylimidazolyl dimer and 2-(o-fluorophenyl)-4,5-diphenylimidazolyl dimer.

The suitable proportion of a thermal polymerization initiator added is from 0.5 to 15 weight %, preferably from 1 to 10 weight %, based on the total solid components in the thermal polymerization layer. When the proportion is below the foregoing range, the thermal polymerization layer obtained has low sensitivity; while, when the proportion is beyond the foregoing range, there occurs deterioration in film property of the thermal polymerization layer obtained.

In addition to the basic ingredients described above, the thermal polymerization layer of the present invention may further contain well-known additives, such as a monomer or prepolymer having an addition polymerizable ethylenically unsaturated bond, an aqueous alkali-soluble binder polymer, a polymerization accelerator, a thermal polymerization inhibitor for controlling unnecessary thermal polymerization during production and storage, a coloring agent, an inorganic filler and a plasticizer, if desired.

Examples of a monomer or prepolymer having an addition polymerizable ethylenically unsaturated bond include esters of unsaturated carboxylic acids (e.g., acrylic acid, methacrylic acid, itaconic acid, crotonic acid, isocrotonic acid, maleic acid) and aliphatic polyhydric alcohol compounds, and amides of unsaturated carboxylic acids and aliphatic polyamine compounds.

Examples of a monomer as an ester of an aliphatic polyhydric alcohol compound and an unsaturated carboxylic acid include (meth)acrylic acid esters, such as triethylene glycol di(meth)acrylate, tetramethylene glycol di(meth) acrylate, trimethylolpropane tri(meth)acrylate, trimethylolpropane tri((meth)acryloyloxypropyl)ether, trimethylolmethane tri(meth)acrylate, tetraethylene glycol di(meth) acrylate, polyethylene glycol di(meth)acrylate, pentaerythritol di(meth)acrylate, pentaerythritol tri(meth) acrylate, pentaerythritol tetra(meth)acrylate, dipentaerythritol penta(meth)acrylate, dipentaerythritol hexa(meth) acrylate, sorbitol tetra(meth)acrylate, sorbitol penta(meth) acrylate, sorbitol hexa(meth)acrylate, tris((meth) acryloyloxyethyl)isocyanurate and polyester (meth)acrylate oligomers.

Examples of an itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Examples of a crotonic acid ester include ethylene glycol dicrotonate, tetramethylene glycol dicrotonate, pentaerythritol dicrotonate and sorbitol tetracrotonate.

Examples of an isocrotonic acid ester include ethylene glycol diisocrotonate, pentaerythritol diisocrotonate and sorbitol tetraisocrotonate.

Examples of a maleic acid ester include ethylene glycol dimaleate, triethylene glycol dimaleate, pentaerythritol dimaleate and sorbitol tetramaleate.

The ester monomers described above may be added as mixtures of two or more thereof.

Examples of a monomer as an amide of aliphatic polyamine compound and unsaturated carboxylic acid include methylenebisacrylamide, methylenebismethacrylamide, 1,6-hexamethylenebisacrylamide, 1,6-hexamethylenebismethacrylamide, diethylenetriamine trisacrylamide, xylylenebisacryl-amide and xylylenebismethacrylamide.

As other examples, the vinyl urethane compounds having at least two polymerizable vinyl groups per one molecule as disclosed in JP-B-48-41708 (the term "JP-B" as used herein means an "examined Japanese patent publication"), which are prepared by adding hydroxyl group-containing vinyl monomers represented by the following formula (A) to polyisocyanate compounds having at least two isocyanate groups per one molecule are exemplified:

$$CH_2{=}C(R)COOCH_2CH(R')OH \qquad (A)$$

wherein R and R' are each H or $CH_3$.

Further, the urethane acrylates as disclosed in JP-A-51-37193 and the polyfunctional acrylates and methacrylates as disclosed in JP-A-48-64183, JP-B-49-43191 and JP-B-52-30490, such as polyester acrylates and epoxyacrylates prepared by reaction of epoxy resins and (meth)acrylates, are exemplified. In addition, the compounds reported as photocuring monomers and oligomers in *Nippon Settyaku Kyokai Shi* (*Journal of Japanese Adhesive Society*), Vol. 20, No. 7, pp. 300–308 (1984) can also be used.

The suitable proportion of a monomer or prepolymer having an addition polymerizable ethylenically unsaturated bond is 20 weight % or less based on the total solid components in the thermal polymerization layer. When such a monomer or prepolymer is added in a proportion of greater than 20 weight %, it becomes difficult to form firm images.

Examples of an aqueous alkali-soluble binder polymer which can be added to the thermal polymerization layer of the present invention, if desired, include the addition polymers having carboxylic acid groups in their side chains as disclosed in JP-B-54-34327, JP-B-58-12577, JP-B-54-25957 and JP-A-54-92723, e.g., methacrylic acid copolymers, acrylic acid copolymers, itaconic acid copolymers, crotonic acid copolymers, maleic acid copolymers and partially esterified maleic acid copolymers. Similarly to these copolymers, acidic cellulose derivatives having carboxylic acid groups in their side chains can be added as the binder polymer. Besides these polymers, the cyclic acid anhydrides-added hydroxyl group-containing addition polymers are useful.

Suitable examples of such a binder polymer include a copolymer of methyl methacrylate and methacrylic acid, a copolymer of methyl methacrylate, ethyl acrylate and methacrylic acid, a copolymer of styrene, ethyl acrylate and methacrylic acid, a copolymer of styrene, methyl methacrylate, ethyl acrylate and methacrylic acid, and a copolymer of methyl methacrylate, butyl acrylate, acrylic acid and acrylonitrile The suitable amount of aqueous alkali-soluble binder polymer added depends on the addition amount of alkali-soluble polymer having addition polymerizable unsaturated groups in its side chains and that of addition polymerizable monomer or prepolymer, but it is generally 30 weight % or less based on the total solid components in the thermal polymerization layer. When the amount of binder polymer added is beyond such a range, sensitivity drop becomes serious.

Examples of the polymerization accelerators suitable for the present invention include polymerization accelerators represented by amines, thiols and disulfides, and chain transfer catalysts.

Concrete examples thereof include amines such as N-phenylglycine, triethanolamine and N,N-diethylaniline, the thiols disclosed in U.S. Pat. No. 4,414,312 and JP-A-64-13144, the disulfides disclosed in JP-A-2-29161, the thiones disclosed in U.S. Pat. No. 3,558,322 and JP-A-64-17048, and the o-acylthiohydroxamates and the N-alkoxypyridine thiones disclosed in JP-A-2-291560. The suitable proportion of polymerization accelerator added is from 0.1 to 5 weight % based on the total solid components in the thermal polymerization layer. When the polymerization accelerator is added in a proportion below the foregoing range, no effect can be expected from such an addition. When the proportion is beyond the foregoing range, on the other hand, the thermal polymerization layer tends to suffer deterioration in film properties.

Examples of a thermal polymerization inhibitor suitable for the present invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and cerium salt of N-nitrosophenylhydroxylamine. The suitable proportion of thermal polymerization inhibitor added is from 0.01 to 2 weight % based on the total solid components in the thermal polymerization layer. When the proportion is below the foregoing range, the thermal stability becomes poor; while when it is beyond the foregoing range the sensitivity drop becomes serious.

Examples of a coloring agent usable in the present invention include pigments, such as phthalocyanine pigments, azo pigments and titanium dioxide, and dyes such as Ethyl Violet, Crystal Violet, azo dyes, anthraquinone dyes and cyanine dyes. The suitable proportion of dyes or pigments added is from 0.5 to 10 weight % based on the total solid components in the thermal polymerization layer. When the proportion is below the foregoing range, no coloring effect can be expected from such addition; while when it is beyond the foregoing range the thermal polymerization layer tends to suffer deterioration in film quality.

Examples of a plasticizer usable in the present invention include dioctyl phthalate, didodecyl phthalate, triethylene glycol caprylate, dimethyl glycol phthalate, tricresyl phosphate, dioctyl adipate, dibutyl sebacate and triacetyl glycerin. Such a plasticizer can be added in a proportion of 10 weight % or less based on the total solid components in the thermal polymerization layer. When the proportion is beyond 10 weight %, it becomes difficult to produce firm images.

Prior to coating a composition for the thermal polymerization layer of the present invention on the support, the composition is dissolved in a solvent properly selected from a wide variety of organic solvents. Examples of an organic solvent usable herein include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, 1-methoxy-2-propanol, 2-propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy-1-propanol, methoxymethoxyethanol, diethylene glycol monomethyl ether, diethylene glycol monoethyl ether, diethylene glycol dimethyl ether, diethylene glycol diethyl ether, 1-methoxy-2-propanol monoethyl ether acetate, 3-methoxypropyl acetate, N,N-dimethylformamide, dimethyl sulfoxide, γ-butyrolactone, methyl lactate and ethyl lactate. These solvents may be used alone or as a mixture of two or more thereof. The suitable solid component concentration in the coating solution is preferably from 2 to 50 weight %.

The suitable dry coverage of the thermal polymerization layer coated is from about 0.1 to about 10 g/m$^2$, preferably from 0.5 to 5 g/m$^2$.

Examples of a water-soluble polymer usable in water-soluble overcoat layer of the present invention include polyvinyl alcohol, partial ester, ether or acetal of polyvinyl alcohol containing vinyl alcohol units in a proportion required for being soluble in water, polyvinyl acetate having a hydrolysis degree of at least 65%, gelatin, gum arabic, a copolymer of methyl vinyl ether and maleic anhydride, polyvinyl pyrrolidone, a copolymer of vinyl alcohol and vinyl pyrrolidone, and high molecular water-soluble polyethylene oxides having their average molecular weight of 100,000 to 3,000,000. These polymers may be used as a mixture of two or more thereof, if desired.

The compound capable of converting light into heat used in combination with the water-soluble resin as described above may be any of materials capable of absorbing light of wavelengths of not shorter than 700 nm, and various pigments and dyes are included therein. Specifically, pigments which can be utilized herein include commercially available pigments and pigments described in *Color Index* (*C.I.*) *Binran* (*Color Index* (*C.I.*) *Handbook*), compiled by Nihon Ganryo Gijutsu Kyokai (1977), *Saishin Ganryo Binran* (*Handbook of Latest Pigments*), compiled by Nihon Ganryo Gijutsu Kyokai (1977), *Saishin Ganryo Oyo Gijutsu* (*Latest Pigment Application Techniques*), published by CMC Publishing Co., Ltd. (1986), and *Insatsu Ink Gijutsu* (*Printing Ink techniques*), published by CMC Publishing Co., Ltd. (1984).

More specifically, various pigments, such as black pigments, brown pigments, red pigments, violet pigments, blue pigments, green pigments, fluorescent pigments, metallic Examples of such pigments include insoluble azo pigments, azo lake pigments, condensed azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, in-mold lake pigments, azine pigments, nitroso pigments, nitro pigments, natural pigments, fluorescent pigments, inorganic pigments and carbon black.

Those pigments may be used without surface treatment, or they may undergo surface treatment before use. Suitable examples of a method of treating the surface of the pigment include a method of coating the pigment surface with a hydrophilic resin or a lipophilic resin, a method of attaching a surfactant to the pigment surface and a method of attaching a reactive substance (such as silica sol, alumina sol, silane coupling agents, epoxy compounds and isocyanate compounds) to the surface of the pigment. These surface treatment methods are described in *Kinzoku Sekken no Seisitsu to Oyo* (*Properties and Applications of Metal Soap*), Saiwai Shobo Co., Ltd., *Insatsu Ink Gijutsu* (*Printing Ink techniques*), published by CMC Publishing Co., Ltd. (1984), and *Saishin Ganryo Oyo Gijutsu* (*Latest Pigment Application Techniques*), published by CMC Publishing Co., Ltd. (1986). Of the pigments described above, pigments capable of absorbing infrared or near infrared radiation are preferred in particular since they can impart suitability for utilization of infrared laser.

Examples of a pigment suitable for infrared or near infrared absorption include carbon black, hydrophilic resin-coated carbon black and silica sol-modified carbon black. In particular, carbon black having the surface coated with hydrophilic resin or silica sol is useful, because it is easily dispersed into water-soluble resins and the hydrophilicity is not impaired.

The suitable grain size of pigment is from 0.01 to 1 $\mu$m, preferably from 0.01 to 0.5 $\mu$m. As a method of dispersing pigments, conventional dispersion techniques for ink or toner production can be employed. Examples of a dispersing apparatus usable therein include an ultrasonic disperser, a sand mill, an attritor, a pearl mill, a super mill, a ball mill, an impeller, a disperser, a KD mill, a colloid mill, a dynatron, a three-roll mill and a pressure kneader. Details of dispersion techniques are described in *Saishin Ganryo Oyo Gijutsu* (*Latest Pigment Application Techniques*), published by CMC Publishing Co., Ltd. (1986).

Dyes usable as a compound capable of converting light into heat include commercially available dyes and well-known dyes as described, e.g., in Senryou Binran (Handbook of Dyes) compiled by Yuki Gosei Kagaku Kyokai (1970). As examples of such dyes, azo dyes, metal complex azo dyes, pyrazolone azo dyes, anthraquinone dyes, phthalocyanine dyes, carbonium dyes, quinoneimine dyes, methine dyes and cyanine dyes are exemplified. Of these dyes, infrared or near infrared absorbing dyes are preferred, in particular, in use of lasers emitting the infrared or near infrared radiation.

Examples of an infrared or near infrared absorbing dye include the cyanine dyes as disclosed in JP-A-58-125246, JP-A-59-84356 and JP-A-60-78787, the methine dyes as disclosed in JP-A-58-173696, JP-A-58-181690 and JP-A-58-194595, the naphthoquinone dyes as disclosed in JP-A-58-112793, JP-A-58-224793, JP-A-59-48187, JP-A-59-73996, JP-A-60-52940 and JP-A-60-63744, the squarylium dyes as disclosed in JP-A-58-112792, the cyanine dyes disclosed in British Patent 434,875, the dyes disclosed in U.S. Pat. No. 4,756,993, the cyanine dyes disclosed in U.S. Pat. No. 4,973,572, and the dyes disclosed in JP-A-10-268512.

In addition, the near infrared radiation-absorbing sensitizers disclosed in U.S. Pat. No. 5,156,938 can be suitably used as dyes. Besides the dyes described above, the substituted arylbenzo(thio)pyrylium salts disclosed in U.S. Pat. No. 3,881,924, the trimethinethiapyrylium salts disclosed in JP-A-57-142645 (corresponding to U.S. Pat. No. 4,327,169), the pyrylium compounds disclosed in JP-A-58-181051, JP-A-58-220143, JP-A-59-41363, JP-A-59-84248, JP-A-59-84249, JP-A-59-146063 and JP-A-59-146061, the cyanine dyes disclosed in JP-A-59-216146, the pentamethinethiopyrylium salts disclosed in U.S. Pat. No. 4,283,475, the pyrylium compounds disclosed in JP-B-5-13514 and JP-B-5-19702, and Epolight III-178, Epolight III-130 and Epolight III-125 (produced by Epolin Co., Ltd.) can be favorably used.

Of the dyes as described above, examples of the preferred dyes illustrated below by their respective structural formulae are exemplified.

(IR-1)

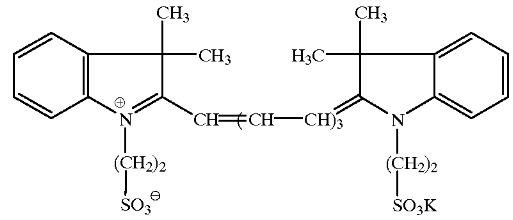

(IR-2)

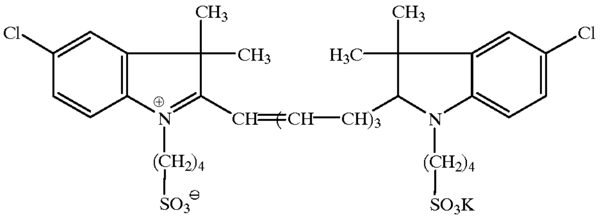

(IR-3)

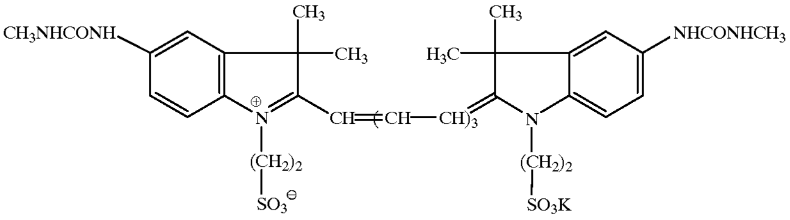

(IR-4)

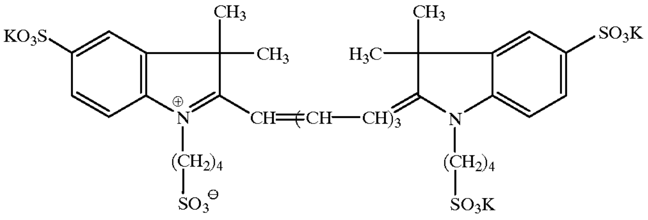

-continued
(IR-5)
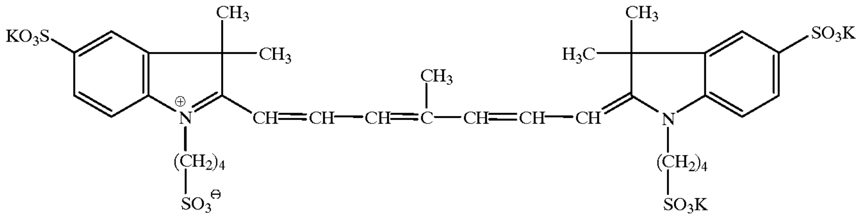
(IR-6)
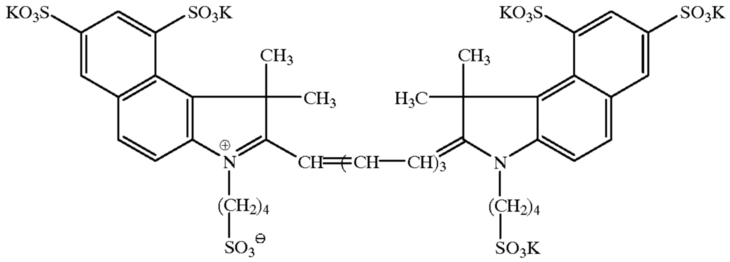
(IR-7)
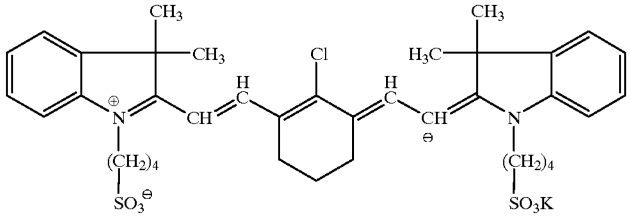
(IR-8)
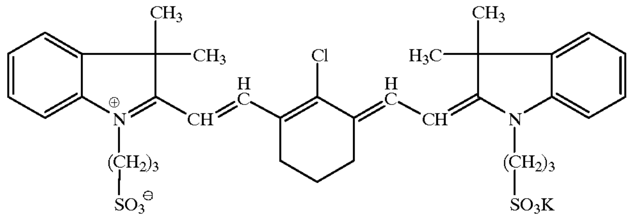
(IR-9)
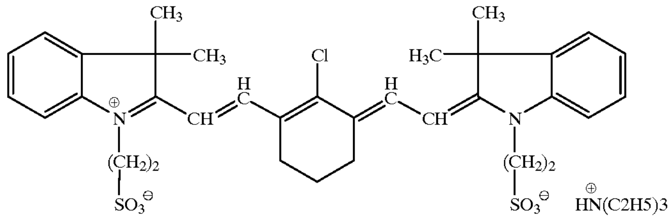
(IR-10)
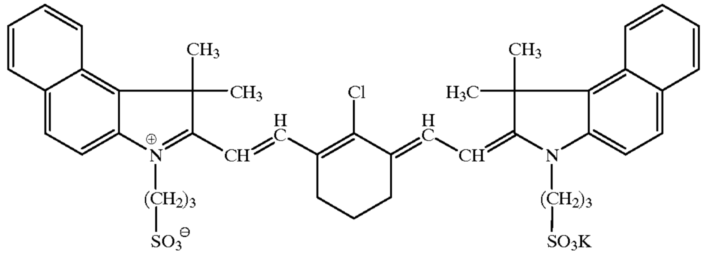

-continued (IR-11)

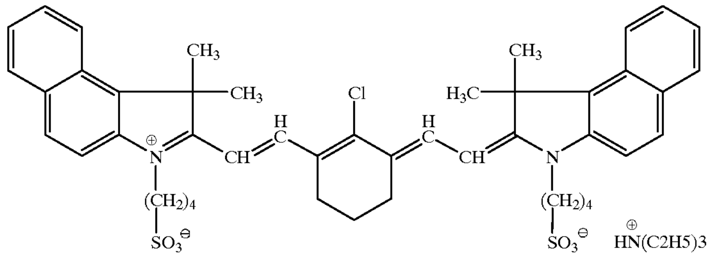

The suitable proportion of such a pigment or dye based on the total solid components in the overcoat layer is from 1 to 70 weight %, preferably from 2 to 50 weight %. In particular, the proportion ranging from 2 to 30 weight % is effective when the dye is incorporated in the overcoat layer, while the proportion ranging from 20 to 50 weight % is effective when the pigment is incorporated therein. When the proportion of the pigment or dye in the overcoat layer is lower than the aforesaid lower limit, the sensitivity becomes low; while it is higher than the aforesaid upper limit, the uniformity of the layer is lost and the capacity for shutting out oxygen is lowered to result in a sensitivity drop.

In the case where the overcoat layer is formed by coating an aqueous solution, nonionic surfactants can be added to the aqueous solution for the purpose of securing uniformity for the layer coated. Examples of nonionic surfactants usable for such a purpose include sorbitan tristearate, sorbitan monopalmitate, sorbitan trioleate, stearic acid monoglyceride, polyoxyethylene nonyl phenyl ether, and polyoxyethylene dodecyl ether.

The suitable proportion of such a nonionic surfactant based on the total solid components in the overcoat layer is from 0.05 to 5 weight %, preferably from 1 to 3 weight %.

The suitable thickness of the overcoat layer provided in the present invention is from 0.1 to 5.0 $\mu$m, preferably from 0.5 to 3.0 $\mu$m. When the thickness is too thick, the load imposed on a developer for removing the overcoat layer is increased. When the thickness is too thin, on the other hand, the capacity for shutting out oxygen becomes insufficient.

In the heat-sensitive lithographic printing plate precursor of the present invention, images are formed by the action of heat. More specifically, the image formation can be performed by directly imagewise recording (i.e., direct drawing image recording) with a thermal recording head, scanning exposure with an infrared laser, high (illumination) intensity flash exposure with xenon discharge bulbs, or exposure with an infrared lamp. In particular, the scanning exposure with semiconductor lasers emitting infrared radiation of wavelengths of 700 to 1200 nm or high-output solid-state infrared lasers, such as YAG laser, can be used to advantage.

From the printing plate precursor exposed imagewise, the overcoat layer and the unexposed area of the thermally polymerizing polymer layer are removed with a developer, and thereby a printing plate is made. The developer suitably used f or the lithographic printing plate precursor of the present invention is an alkaline aqueous solution. Examples of an appropriate alkali agent for the developer include sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium hydrogen carbonate, potassium hydrogen carbonate, sodium carbonate, potassium carbonate, ammonia, monoethanolamine, diethanolamine, triethanolamine, dipropanolamine and tripropanolamine. These alkali agents are added so that the alkaline aqueous solution has an alkali concentration of 0.1 to 10 weight %, preferably 0.5 to 5 weight %.

Further, an organic solvent such as benzyl alcohol, 2-phenoxyethanol or 2-butoxyethanol can be added to the developer used in the present invention, if needed. And any of anionic, nonionic and amphoteric surfactants can be added as a surfactant for the developer used in the present invention.

Furthermore, well-known additives including a storage stabilizer such as sodium sulfite, a chelating agent such as EDTA, a coloring agent and a defoaming agent can be added to the developer used in the present invention, if desired.

EXAMPLE

The present invention will now be illustrated in more detail by reference to the following examples, but these examples should not be construed as limiting the scope of the present invention in any way.

Example 1

(Preparation of Aluminum Substrate)

The surface of a 0.24 mm-thick aluminum plate (material quality: 1050) was grained using a nylon brush and a 400-mesh pumice-water suspension, and washed thoroughly with water. This plate was etched by immersion in a 15 weight % aqueous solution of sodium hydroxide, washed with water, and further neutralized with 1 weight % $HNO_3$ for neutralization. Then, the thus etched plate surface was subjected to electrolytically graining treatment wherein a 0.7 weight % aqueous solution of nitric acid was used as an electrolytic solution and thereto an alternating current of rectangular-wave form (i.e., square wave form) was applied so that the quantity of electricity at the anode was 160 Coulomb/dm$^2$. After washing with water, the aluminum plate was etched again by immersion in a 10 weight % aqueous solution of sodium hydroxide, and washed again with water. Then, the aluminum plate was desmutted by immersion in a 30 weight % aqueous solution of $H_2SO_4$, washed with water, and further anodized by applying a direct current thereto in a 20 weight % aqueous solution of $H_2SO_4$ till the anodic coating having a thickness of 2.7 g/m$^2$ was formed. The thus anodized aluminum plate was washed with water, and then dried.

Further, a liquid composition (sol solution (1)) for the sol-gel method was prepared in the following manner:

In a 100 ml flask were placed 18.7 g of tetraethyl orthosilicate, 1.3 g of 3-methacryloxypropyltrimethoxysilane, 50 g of methanol, 7.2 g of ion exchanged water and 6.1 g of phosphoric acid in this order. Immediately thereafter, the flack was soaked in a 23° C. water bath, and the contents in the flask were stirred with a magnetic stirrer. Then, the flask mouth was fit up with a reflux condenser as the flask was immersed in the 23° C. water bath, and the stirring was continued for 60 minutes as the flask was in such a situation. After the completion of 60 minutes' reaction, the flask contents was transferred into a plastic vessel, and immediately diluted with 10 times (by weight) as much methanol. Thus, the sol solution (1) was obtained.

The thus obtained sol solution (1) was further diluted with a methanol/ethylene glycol (9/1 by weight) mixture, coated on the anodically oxidized substrate by means of a whirler so that the amount of Si was 3 mg/$m^2$, and then dried at 100° C. for 1 minute.

(Coating of Thermal Polymerization Layer)

The thus surface-treated aluminum substrate was coated with a Coating Solution A described below so as to have a dry coverage of 1.5 g/$m^2$, and then dried at 100° C. for 3 minutes.

| Composition of Coating Solution A: | |
|---|---|
| Copolymer of allylmethacrylate and methacrylic acid (copolymerization ratio: 8/2 by mole; weight average molecular weight: 10 × $10^4$) | 3.3 g |
| Pentaerythritol tetraacrylate (produced by Shin-Nakamura Kagaku Co., Ltd.) | 0.4 g |
| 3.3',4,4'-Tetrakis (t-butylperoxycarbonyl)-benzophenone (BTTB, produced by Nippon Oils & Fats Co., Ltd.) | 0.2 g |
| p-Methoxyphenol | 0.01 g |
| Copper phthalocyanine pigment (produced by Mikuni Shikiso Co., Ltd.) | 0.2 g |
| Surfactant (Megafac F-177, trade name, produced by Dai-Nippon Ink & Chemicals, Inc.) | 0.02 g |
| Methyl ethyl ketone | 30 g |
| 1-Methoxy-2-propanol | 23 g |

(Coating of Overcoat Layer)

On the thermal polymerization layer, the following coating solution for an overcoat layer was coated, and dried at 100° C. for 2 minutes to form the overcoat layer having a dry coverage of about 2.0 g/$m^2$. Thus, a heat-sensitive lithographic printing plate precursor was prepared.

| Composition of Coating Solution OC-1 for Overcoat Layer: | |
|---|---|
| Polyvinyl alcohol (PVA-217, produced by Kurarey Co., Ltd.) | 2.2 g |
| Water-soluble dye IR-11 illustrated in the present specification | 0.4 g |
| Polyoxyethylene nonyl phenyl ether | 0.04 g |
| Water | 42 g |

The lithographic printing plate precursor thus prepared was loaded in a plate setter equipped with a 830-nm semiconductor laser device ("40 watts Trend Setter", trade name, made by CREO CO., Canada), and exposed to the laser beams under a condition that the amount of energy applied thereto was adjusted to 800 mJ/$cm^2$. The exposed plate was development-processed using a processor, Stablon 900NP (made by Fuji Photo Film Co., Ltd.), a 1:9 diluted solution of Developer LP-D (an alkaline aqueous solution containing potassium silicate, produced by Fuji Photo Film Co., Ltd.) and a 1:1 diluted solution of Finisher FP-2 (produced by Fuji Photo Film Co., Ltd.). All these exposure and development operations were carried out under a common indoor white fluorescent lamp.

The thus processed printing plate was mounted in a printing press, Harris-Aurelia, and subjected to printing operations using a fountain solution consisting of a etching solution and 10 vol % aqueous solution of isopropyl alcohol and ink. As a result, 50,000 plates of stain-free, good-quality printed matter were obtained.

Examples 2 to 4

Heat-sensitive lithographic printing plate precursors were prepared in the same manner as in Example 1, except that the water-soluble dye used in the overcoat layer of Example 1 was replaced by IR-1 in Example 2, IR-9 in Example 3 and IR-10 in Example 4. Then, these printing plate precursors were each subjected to the same exposure, development and printing operations as in Example 1. As a result, every printing plate provided stain-free, good-quality printed matter.

Example 5

A heat-sensitive lithographic printing plate precursor was prepared in the same manner as in Example 1, except that the following Coating Solution OC-2 was used for forming the overcoat layer in place of the Coating Solution OC-1 used in Example 1. Then, the printing plate precursor thus prepared was subjected to the same exposure, development and printing operations as in Example 1. As a result, the printing plate provided stain-free, good-quality printed matter.

| Composition of Coating Solution OC-2 for Overcoat Layer: | |
|---|---|
| Polyvinyl alcohol (PVA-105, produced by Kurarey Co., Ltd.) | 2.15 g |
| Polyvinyl pyrrolidone (K30, produced by GAF) | 0.15 g |
| Water-soluble dye IR-11 illustrated in the present specification | 0.4 g |
| Polyoxyethylene nonyl phenyl ether | 0.04 g |
| Water | 42 g |

Example 6

A heat-sensitive lithographic printing plate precursor was prepared in the same manner as in Example 1, except that the Coating Solution A for thermal polymerization layer and the Coating Solution OC-1 for overcoat layer in Example 1 were replaced by the following Coating Solution B and the following Coating Solution OC-3 respectively.

| Composition of Coating Solution B: | |
|---|---|
| Copolymer of allylmethacrylate and methacrylic acid (copolymerization ratio: 8/2 by mole; weight average molecular weight: 10 × $10^4$) | 3.9 g |
| Bis (t-butylperoxy) isophthalate | 0.2 g |
| N-Phenylglycine | 0.03 g |
| p-Methoxyphenol | 0.01 g |
| Copper phthalocyanine pigment (produced by Mikuni Shikiso Co., Ltd.) | 0.2 g |
| Surfactant (Megafac F-177, trade name, produced by Dai-Nippon Ink & Chemicals, Inc.) | 0.02 g |
| Methyl ethyl ketone | 30 g |
| 1-Methoxy-2-propanol | 23 g |

| (Coating of Overcoat Layer) Composition of Coating Solution OC-3 for Overcoat Layer: | |
|---|---|
| Polyvinyl alcohol (PVA-105, produced by Kurarey Co., Ltd.) | 2.2 g |
| Water-soluble dye IR-10 illustrated in the present specification | 0.4 g |
| Polyoxyethylene nonyl phenyl ether | 0.04 g |
| Water | 42 g |

The printing plate precursor thus prepared was exposed to energy of 800 $mJ/m^2$ by means of the same plate setter as used in Example 1, and then subjected to the same development and printing operations as in Example 1. As a result, the printing plate provided stain-free, good-quality printed matter.

Example 7

A heat-sensitive lithographic printing plate precursor was prepared in the same manner as in Example 6, except that bis(t-butylperoxy)isophthalate used in the Coating Solution B was replaced by o-Cl-HABI. Then, the printing plate precursor prepared was exposed to energy of 800 $mJ/m^2$ by means of the same plate setter as used in Example 1, and further subjected to the same development and printing operations as in Example 1. As a result, the printing plate provided stain-free, good-quality printed matter.

Example 8

A heat-sensitive lithographic printing plate precursor was prepared in the same manner as in Example 1, except that the copolymer of allylmethacrylate and methacrylic acid in the Coating Solution A for the thermal polymerization layer was replaced by the polymer prepared by modifying 5 mole % of methacrylic acid units constituting a copolymer of methyl methacrylate, ethyl methacrylate, methacrylic acid and acrylonitrile (ratio of comonomers: 65/8/13/14, weight average molecular weight: $12\times10^4$) with glycidyl methacrylate in accordance with the method as disclosed in JP-A-10-260536.

The printing plate precursor thus prepared was subjected to the same exposure, development and printing operations as in Example 1. As a result, the printing plate provided stain-free, good-quality printed matter.

Effect of the Invention

Lithographic printing plate precursors prepared in accordance with the present invention are suitable for CTP system and can be handled in a bright room.

While the invention has been described in detail and with reference to specific embodiments thereof, it will be apparent to one skilled in the art that various changes and modifications can be made therein without departing from the spirit and scope thereof.

What is claimed is:

1. A heat-sensitive lithographic printing plate precursor, comprising a support having a hydrophilic surface on which (1) a thermal polymerization layer comprising an aqueous alkali-soluble polymer having addition polymerizable unsaturated bonds at its side chains and a thermal polymerization initiator and (2) a water-soluble overcoat layer comprising a water-soluble polymer which is a polymer containing vinyl alcohol units in a proportion of at least 65 mole %, and a compound capable of converting light into heat are provided in this order.

2. The heat-sensitive lithographic printing plate precursor as in claim 1, wherein the addition polymerizable unsaturated bonds are constituted by functional groups in at least one group selected from the group consisting of allyl, acryl and methacryl groups.

3. The heat-sensitive lithographic printing plate precursor as in claim 1, wherein the thermal polymerization initiator is a peroxide or a hexaarylbiimidazole compound.

* * * * *